US010658987B2

(12) United States Patent
Smith et al.

(10) Patent No.: US 10,658,987 B2
(45) Date of Patent: May 19, 2020

(54) AMPLIFIER CIRCUIT FOR CRYOGENIC APPLICATIONS

(71) Applicant: Rambus Inc., Sunnyvale, CA (US)

(72) Inventors: Richelle L. Smith, Los Altos, CA (US); Roxanne Vu, San Jose, CA (US); Carl W. Werner, Los Gatos, CA (US)

(73) Assignee: Rambus Inc., Sunnyvale, CA (US)

(*) Notice: Subject to any disclaimer, the term of this patent is extended or adjusted under 35 U.S.C. 154(b) by 0 days.

(21) Appl. No.: 16/206,864

(22) Filed: Nov. 30, 2018

(65) Prior Publication Data

US 2019/0190463 A1    Jun. 20, 2019

Related U.S. Application Data

(60) Provisional application No. 62/607,183, filed on Dec. 18, 2017.

(51) Int. Cl.
| | |
|---|---|
| *H03F 1/56* | (2006.01) |
| *H03F 3/45* | (2006.01) |
| *H03K 19/195* | (2006.01) |
| *H01L 27/12* | (2006.01) |
| *H03F 1/30* | (2006.01) |
| *H01L 27/092* | (2006.01) |

(52) U.S. Cl.
CPC ............ *H03F 1/56* (2013.01); *H01L 27/1203* (2013.01); *H03F 1/301* (2013.01); *H03F 3/45228* (2013.01); *H03K 19/195* (2013.01); *H01L 27/0928* (2013.01); *H03F 2200/129* (2013.01); *H03F 2200/222* (2013.01); *H03F 2200/294* (2013.01); *H03F 2200/462* (2013.01); *H03F 2203/45288* (2013.01); *H03F 2203/45528* (2013.01)

(58) Field of Classification Search
None
See application file for complete search history.

(56) References Cited

U.S. PATENT DOCUMENTS

| | | | | |
|---|---|---|---|---|
| 5,936,458 A | * | 8/1999 | Rylov | ........................ H03K 3/38 327/528 |
| 6,218,892 B1 | * | 4/2001 | Soumyanath | ....... H01L 27/0928 257/E27.067 |
| 8,587,063 B2 | * | 11/2013 | Dennard | ........... H01L 21/76254 257/347 |

(Continued)

OTHER PUBLICATIONS

Jose Rui Custodio et al., "A CMOS Inverter-Based Self-Biased Fully Differential Amplifier", Department of Electrical Engineering, Universidade Nova de Lisboa, 2825-114 Monte de Caparica, Portugal, 8 pages.

(Continued)

*Primary Examiner* — Minh D A
*Assistant Examiner* — James H Cho
(74) *Attorney, Agent, or Firm* — Lowenstein Sandler LLP (57) ABSTRACT

The embodiments herein describe technologies of an amplifier circuit that is designed for wideband communication with superconductive components in cryogenic applications, including Josephson Junction integrated circuits, operating in a cryogenic temperature domain (e.g., 4K). The amplifier circuit operates in a temperature domain (e.g., 77K) that is higher than the cryogenic temperature domain of the superconductive components.

20 Claims, 9 Drawing Sheets

(56) References Cited

U.S. PATENT DOCUMENTS

| | | | | |
|---|---|---|---|---|
| 8,593,226 B2* | 11/2013 | Proesel | ................... | H03F 3/08 |
| | | | | 330/260 |
| 8,872,592 B2* | 10/2014 | Huang | ..................... | H03F 3/08 |
| | | | | 330/308 |
| 9,490,757 B2* | 11/2016 | Frank | ..................... | H03F 3/082 |
| 2003/0025562 A1* | 2/2003 | Andreou | ................ | H03F 3/082 |
| | | | | 330/308 |

OTHER PUBLICATIONS

Xu Jian et al., "A high linearity current mode second IF CMOS mixer for a DRM/DAB receiver", Journal of Semiconductors 2015 vol. 36 Issue (5) 055003-5, 12 pages.

* cited by examiner

AMPLIFIER CIRCUIT FOR CRYOGENIC APPLICATIONS

RELATED APPLICATIONS

This application claims the benefit of U.S. Provisional Application No. 62/607,183, filed Dec. 18, 2017, the entire contents of which are incorporated herein by reference.

BACKGROUND

Cryogenic systems may contain circuits that require voltage and current to be transferred from one temperature domain to a lower temperature domain. For example, the electronic system may include a first temperature domain at 300 Kelvin (K) and a second temperature domain at 4K. There are other temperature domains that may be used as the second temperature domain, such as 77K. Copper conductors are used to transfer the voltage and current between components in the temperature domains. The voltage and current on the copper conductors conduct heat into the low temperature domain using two ways: a first way is thermal conduction and the other way is electrical heating.

Heat flow to the second temperature domain in a cryogenic digital system is a concern. To pull the heat out at a cryogenic temperature domain, such as by a cooling subsystem, there is a large efficiency factor that affects the amount of energy at room temperature needed. For signaling between components in two temperature domains, the signaling system is noise limited by the input devices of a complementary metal-oxide-semiconductor (CMOS) input amplifier. This noise may be thermal noise and flicker noise caused by the CMOS input amplifier operating in a higher temperature domain than the transmitter.

BRIEF DESCRIPTION OF THE DRAWINGS

The present disclosure is illustrated by way of example, and not by way of limitation, in the figures of the accompanying drawings.

DETAILED DESCRIPTION

In typical wireline signaling systems for chip-to-chip communications, performance is limited by channel bandwidth (dispersion and frequency dependent attenuation) or by sources of correlated clock/data interference (e.g., crosstalk, supply induced voltage and timing noise, etc.). Most low-noise amplifiers (LNAs) are used in single-ended signaling applications and designed for narrowband signals, such as LNAs used in radio frequency (RF) applications. The embodiments described herein are directed to an amplifier circuit that is designed for wideband communications with components in cryogenic applications, including Josephson Junction integrated circuits, operating in a cryogenic temperature domain (e.g., 4K). In a CMOS signaling system for interfacing to components in an exemplary cryogenic application, the signaling system is noise limited by the input devices of a CMOS input amplifier (e.g., flicker noise and thermal noise). The embodiments described herein are directed to an amplifier circuit operating at 77K, for example, that has improved noise performance. The embodiments described herein are directed to an amplifier design with a precision input impedance match. The amplifier circuit may include two complementary transistor pairs in a fully-differential low-noise input amplifier (LNA) configuration. The amplifier circuit has an input impedance between two input terminals (also referred to as differential terminals). An impedance match at the differential terminals of the amplifier circuit can be adjusted by adjusting any one or more of three bias conditions as described herein, including the adjustment(s) to the PMOS body voltage, the NMOS body voltage, or the current from the common current source. Also, the input impedance of the amplifier circuit can be trimmed to be a stable value over a very wide temperature range, allowing the amplifier circuit to operate in different temperature domains. For example, the embodiments of the amplifier circuit can be implemented in a first component of cryogenic digital systems, like a memory subsystem located in a first cryogenic temperature domain (e.g., 77K). The cryogenic digital system can include a second component, like a processor, in a second cryogenic temperature domain (e.g., 4K) that is less than the first cryogenic temperature domain.

The embodiments herein also describe technologies of cryogenic digital systems, such as a computer system with zero or more components in a first temperature domain (e.g., 273K), zero or more components in a second temperature domain (e.g., 77K) and one or more components, such as components of a processing system in a third temperature domain (e.g., 4K), where the second temperature domain is lower in temperature than the first temperature domain and the third temperature domain is lower in temperature than the second temperature domain. In one embodiment, the second temperature domain is a first cryogenic temperature and the third temperature domain is a second cryogenic temperature that is less than the first cryogenic temperature domain. It should be noted that the U.S. National Institute of Standards and Technology defines cryogenic temperatures as being temperatures below 93.15K (−180° Celsius, −292° Fahrenheit), however, others have defined cryogenic temperatures as being below 123K. In other embodiments, additional components can be located in additional temperatures domains than the first and second temperature domains, described herein, such as a non-cryogenic temperature domain.

Figure 1:
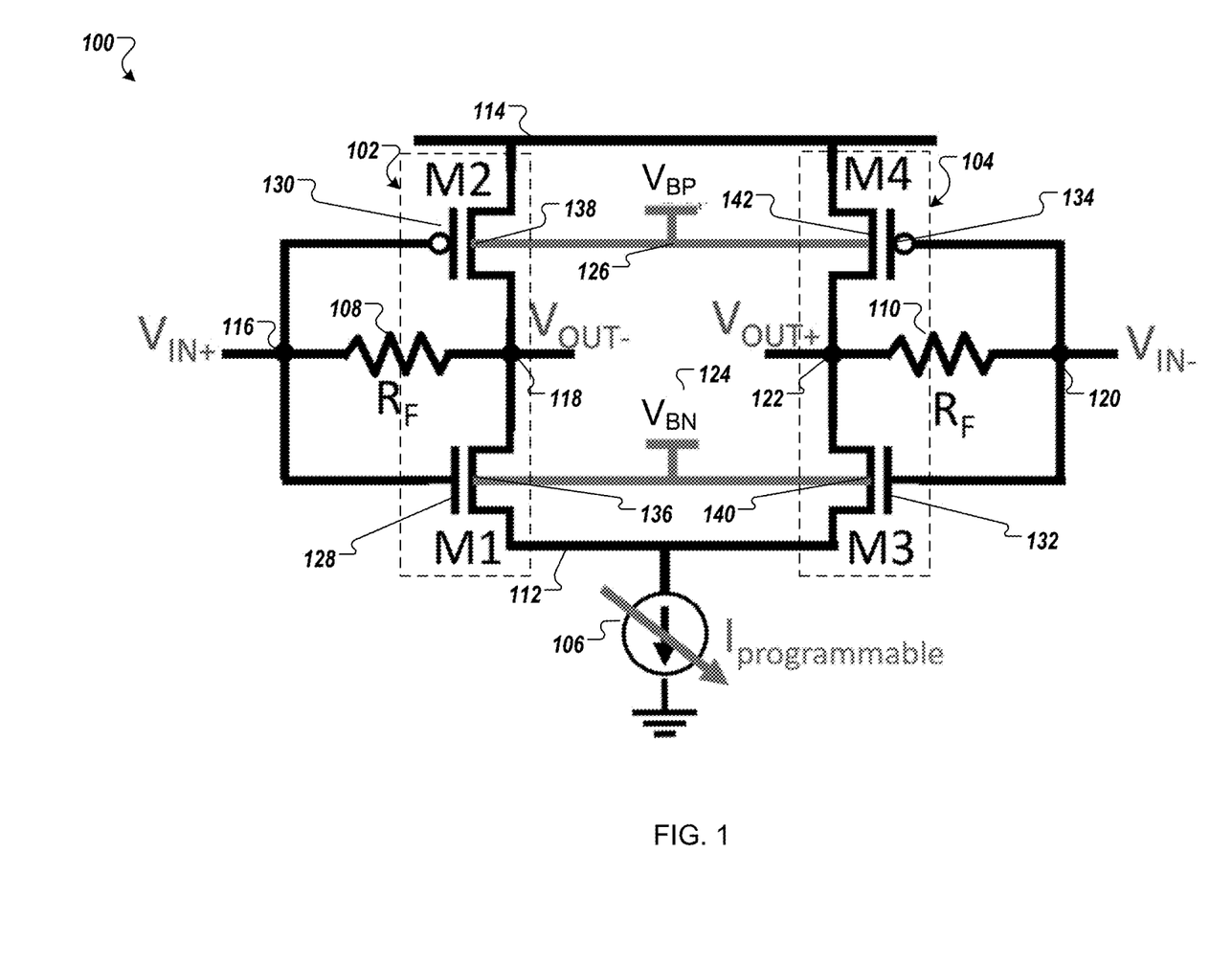
FIG. 1 is a schematic diagram of an amplifier circuit according to one embodiment.

FIG. 1 is a schematic diagram of an amplifier circuit 100 according to one embodiment. The amplifier circuit 100 has a first complementary transistor pair 102, a second complementary transistor pair 104, a current source 106, a first shunt resistor 108, and a second shunt resistor 110. The first complementary transistor pair 102 is coupled between a first source node 112 and a second source node 114. The first source node 112 (a common source node) is coupled to the current source 106 and the second source node 114 is coupled to a voltage supply (not illustrated in FIG. 1) (also referred to as positive supply node). The first complementary transistor pair 102 has a first input terminal 116 and a first output terminal 118. The way that the transistors of the first complementary transistor pair 102 are connected can be considered a first CMOS inverter in one embodiment. The second complementary transistor pair 104 is coupled between the first source node 112 and the second source node 114. As illustrated, the first source node 112 and the second source node 114 are common to the first complementary transistor pair 102 and the second complementary transistor pair 104. Also, because the current source 106 is coupled to the first source node 112, the current source 106 is a common current source for the first complementary transistor pair 102 and the second complementary transistor pair 104. The way that the transistors of the second complementary transistor pair 104 are connected can be considered a second CMOS inverter in one embodiment.

The second complementary transistor pair 104 has a second input terminal 120 and a second output terminal 122. As illustrated in FIG. 1, the first shunt resistor 108 is coupled between the first input terminal 116 and the first output terminal 118 and the second shunt resistor 110 is coupled between the second input terminal 120 and the second output terminal 122. The resistance from the first shunt resistor 108 and the second shunt resistor 110 does not contribute noise directly at the input of the amplifier circuit 100. Also, input impedance (Zin) is a weak function of the resistance from the first shunt resistor 108 and the second shunt resistor 110.

As noted above, an impedance of the input terminals can be adjusted to match an expected channel impedance and the channel impedance can be trimmed to a stable value over a very wide temperature range. In the depicted embodiment, an input impedance (Zin) between the first input terminal 116 and the second input terminal 120 (i.e., an input impedance of the amplifier circuit 100) can be controlled by a transconductance of the first complementary transistor pair 102 and the second complementary transistor pair 104. Transconductance is an electrical characteristic relating to the current through an output of a device to the voltage across an input of the device. More specifically in FIG. 1, the transconductance is the sensitivity of the drain current in the first N-type transistor 128, the first P-Type transistor 130, the second N-type transistor 132, and the second P-type transistor 134 to an input voltage across the first input terminal 116 ($V_{IN+}$) and the second input terminal 120 ($V_{IN-}$). The input impedance at the differential terminals of the amplifier circuit 100 can be adjusted by any one or more of three bias conditions as described herein. Also, the input impedance can be trimmed to be a stable value over a very wide temperature range. In one embodiment, the input impedance between the first input terminal 116 and the second input terminal 120 is controlled by a transconductance of the first complementary transistor pair 102 and the second complementary transistor pair 104, which is adjusted by a magnitude of the current source 106. The current source 106 may be a programmable current source that is controlled by a control signal, for example. In another embodiment, the transconductance of the first complementary transistor pair 102 and the second complementary transistor pair 104 is adjusted by a first magnitude of a first well body bias voltage applied to the first complementary transistor pair 102, a second magnitude of a second well body bias voltage applied to the second complementary transistor pair 104, or both. In some embodiments, the first magnitude and the second magnitude are the same, such as illustrated in FIG. 1. In FIG. 1, a voltage source 124 (labeled Vbbn) is coupled to well body bias voltage terminals (also referred to as "back gates"). In a further embodiment, a second voltage source 126 (labeled Vbbp) is configured to apply a second well body bias voltage to both the first complementary transistor pair 102 and the second complementary transistor pair 104.

In one embodiment, the magnitudes of one or more of the well body bias voltages or the magnitude of the current source can be adjusted to control the input impedance of the amplifier circuit 100. The input impedance can be adjusted over a very wide temperature range. For example, the input impedance can be controlled over a cryogenic temperature range, such as a temperature range between 123 Kelvin (123K) and 4K, a temperature range between 94 Kelvin (94K) and 4K. Alternatively, the input impedance can be controlled over other temperature ranges that those noted herein.

In a further embodiment, as illustrated in FIG. 1, the first complementary transistor pair 102 includes a first N-type transistor 128 and a first P-Type transistor 130. The first N-type transistor 128 has a gate terminal coupled to the first input terminal 116, a drain terminal coupled to the first output terminal 118, and a source terminal coupled to the first source node 112. The first source node 112, as described above, is coupled to the current source 106. The first P-type transistor 130 has a gate terminal coupled to the first input terminal 116, a drain terminal coupled to the first output terminal 118, and a source terminal coupled to the second source node 114. The second source node 114 is coupled to a rail voltage. In a further embodiment, as illustrated in FIG. 1, the second complementary transistor pair 104 includes a second N-type transistor 132 and a second P-type transistor 134. The second N-type transistor 132 has a gate terminal coupled to the second input terminal 120, a drain terminal coupled to the second output terminal 122, and a source terminal coupled to the first source node 112, which is coupled to the current source 106. The second P-type transistor 134 has a gate terminal coupled to the second input terminal 120, a drain terminal coupled to the second output terminal 122, and a source terminal coupled to the second source node 114. The second source node 114 is coupled to the rail voltage.

In another embodiment, the first N-type transistor 128 also has a first well body bias voltage terminal 136 (also referred to as a "back gate") and the first P-type transistor 130 also has a second well body bias voltage terminal 138. The second N-type transistor 132 also has a third well body bias terminal 140 and the second P-type transistor 134 also has a fourth well body bias voltage terminal 142. In a further embodiment, the first well body bias voltage terminal 136 and the third well body bias voltage terminal are coupled to a first well body bias voltage (Vbbn) and the second well body bias voltage terminal 138 and the fourth well body bias voltage terminal 142 are coupled to a second well body bias voltage (Vbbp).

In a further embodiment, each transistor in the first complementary transistor pair 102 is disposed on an insulator BOX region of an insulator buried oxide layer (BOX) layer and each transistor in the second complementary transistor pair 104 is disposed on an insulator BOX region of the BOX layer, as described below with respect to FIGS. 2-3.

It should be noted that the amplifier circuit 100 operates better than a resistively loaded common source amplifier as the P-type transistors serve as both loads and amplifying devices.

In one embodiment, the first complementary transistor pair 102 and the second complementary transistor pair 104 are fabricated using Silicon On Insulator (SOI) technology. In another embodiment, the first complementary transistor pair 102 and the second complementary transistor pair 104 are fabricated using Fully Depleted Silicon On Insulator (FD-SOI) technology, as described below with respect to FIGS. 2-3.

Figure 2:
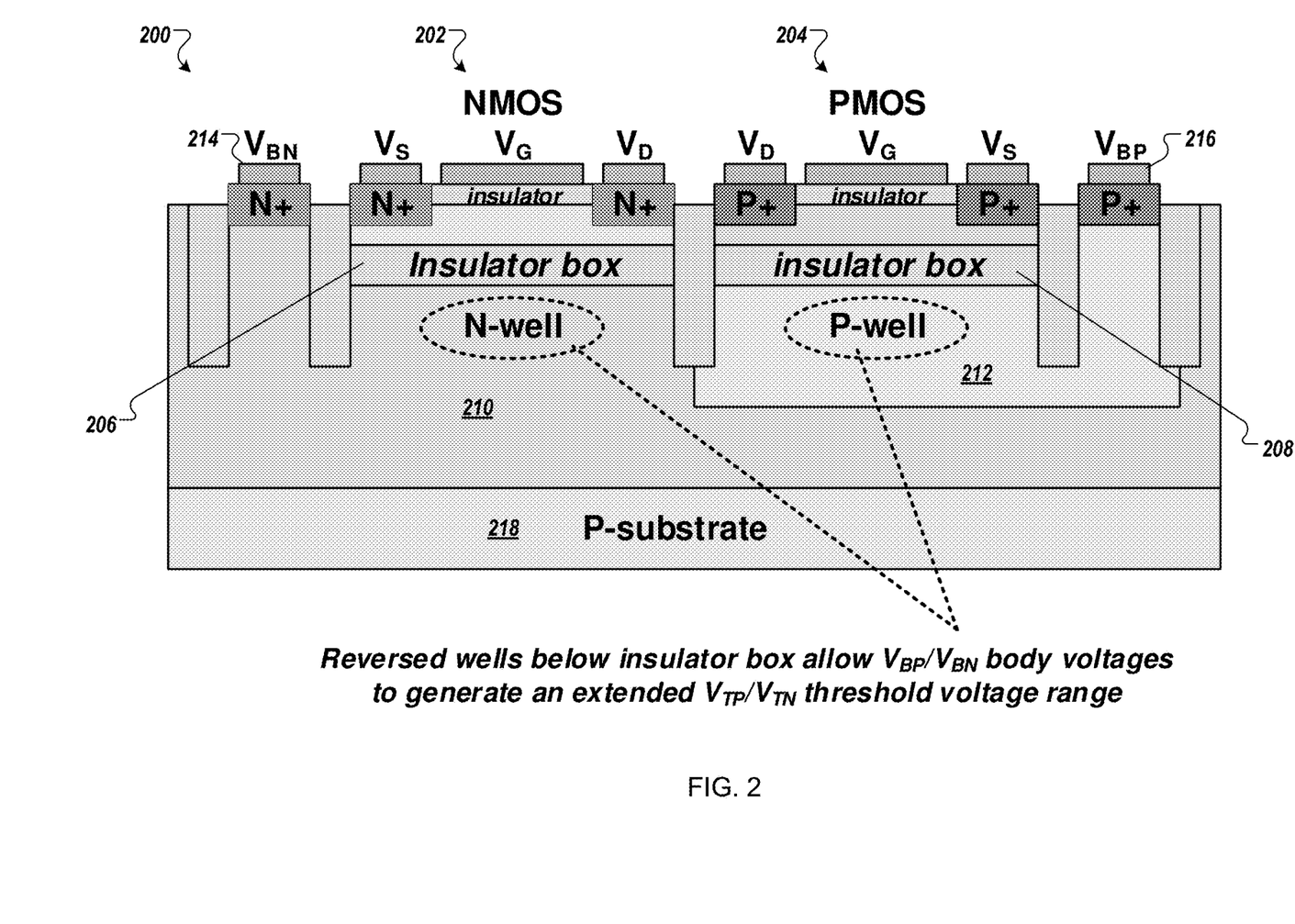
FIG. 2 is a cross sectional view of a complementary transistor pair with reversed wells below insulator buried oxide layer (BOX) regions of a BOX layer according to one embodiment.

FIG. 2 is a cross sectional view of a complementary transistor pair 200 with reversed wells below insulator BOX regions of a BOX layer according to one embodiment. The complementary transistor pair 200 may be either the first complementary transistor pair 102 or the second complementary transistor pair 104 of FIG. 1. The complementary transistor pair 200 includes an N-type transistor 202 (NMOS) and a P-type transistor 204 (PMOS). The N-type transistor 202 is disposed above a first insulator BOX region 206 of a BOX layer and the P-type transistor 204 is disposed above a second insulator BOX region 208 of the BOX layer. The BOX layer may be carved into individual regions such that the MOS transistors are disposed on individual regions of the BOX layer. These regions are referred to herein as insulator BOX regions. The first insulator BOX region 206 is disposed above an N-well 210 and the second insulator BOX region 208 is disposed above a P-well 212. A first well body bias voltage terminal 214 is coupled to the N-well 210 and a second well body bias voltage terminal 216 is coupled to the P-well 212. The P-well 212 can be seated above the N-well 210 and the N-well 210 is disposed above a P-substrate 218. The N-type transistor 202 and P-type transistor 204 are considered reversed wells. The N-type transistor 202 is reversed well because it is in the N-well 210, which is possible because of the first insulator BOX region 206. Similarly, the P-type transistor 204 is reversed well because it is in a P well 212, which is possible because of the second insulator BOX region 208. The reversed wells below the insulator BOX regions allow the first well body bias voltage ($V_{BN}$) and the second well body bias voltage ($V_{BP}$) to generate extended threshold voltage ranges for a first threshold voltage ($V_{TN}$) of the N-type transistor 202 and a second threshold voltage ($V_{TP}$) of the P-type transistor 204. The extended threshold voltage ranges can be used for controlling the input impedance over a very wide temperature range, including across a cryogenic temperature range, such as illustrated in FIGS. 4A-4B.

In one embodiment, the complementary transistor pair 200 is fabricated using Silicon On Insulator (SOI) technology. In another embodiment, the complementary transistor pair 200 is fabricated using Fully Depleted Silicon On Insulator (FD-SOI) technology. Although the embodiment of FIG. 2 shows the complementary transistor pair 200 with reversed wells, in other embodiments, the complementary transistor pair can be implemented with normal wells, such as illustrated in FIG. 3.

Figure 3:
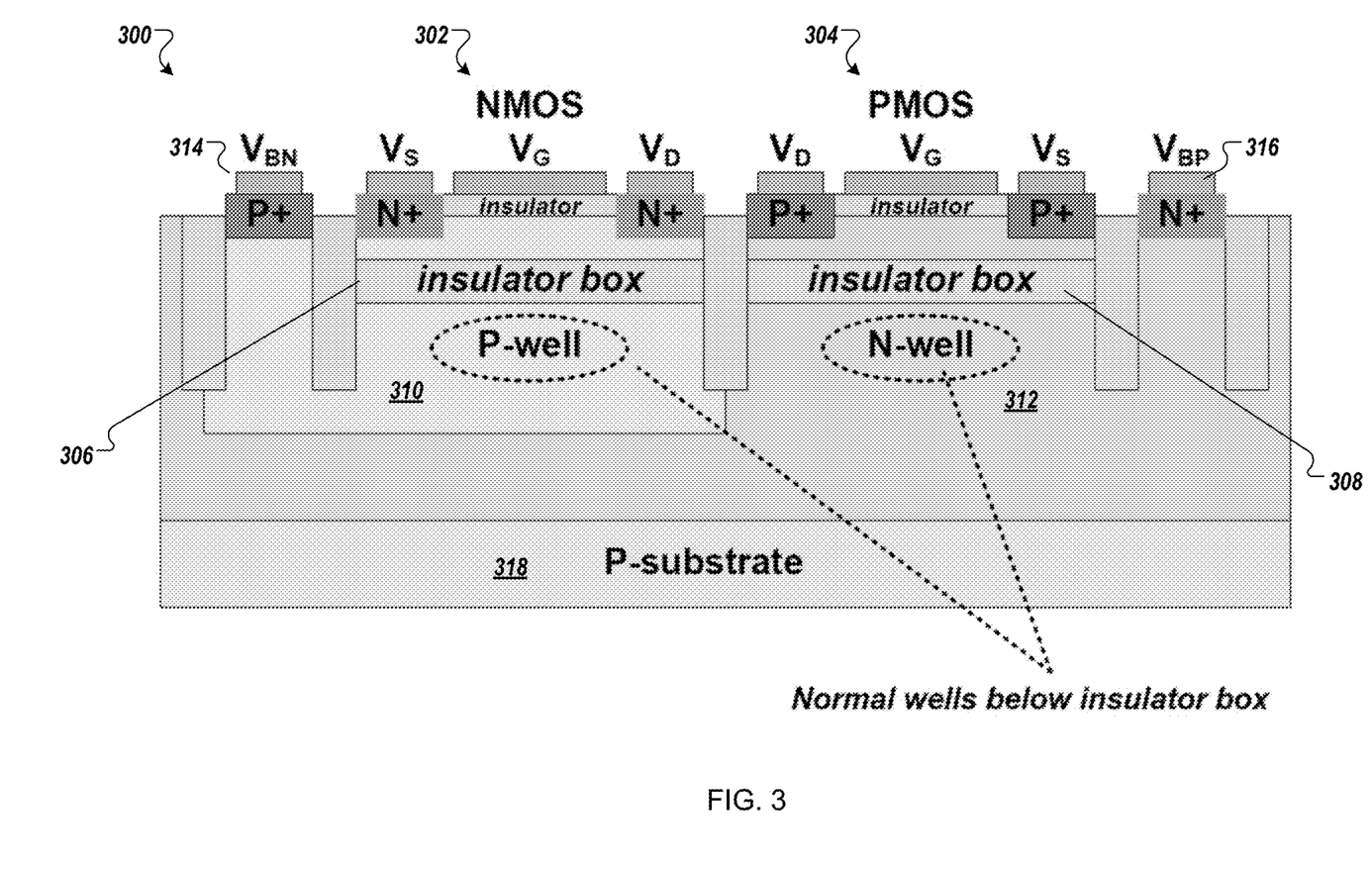
FIG. 3 is a cross sectional view of a complementary transistor pair with normal wells below insulator BOX regions of a BOX layer according to one embodiment.

FIG. 3 is a cross sectional view of a complementary transistor pair 300 with normal wells below insulator BOX regions according to one embodiment. The complementary transistor pair 300 may be either the first complementary transistor pair 102 or the second complementary transistor pair 104 of FIG. 1. The complementary transistor pair 300 includes an N-type transistor 302 (NMOS) and a P-type transistor 304 (PMOS). The N-type transistor 302 is disposed above a first insulator BOX region 306 and the P-type transistor 304 is disposed above a second insulator BOX region 308. The first insulator BOX region 306 is disposed above a P-well 310 and the second insulator BOX region 308 is disposed above an N-well 312. A first well body bias voltage terminal 314 is coupled to the P-well 310 and a second well body bias voltage terminal 316 is coupled to the N-well 312. The P-well 310 can be seated above the N-well 312 and the N-well 312 is disposed above a P-substrate 318. The N-type transistor 302 and the P-type transistor 304 are considered normal wells. The N-type transistor 302 is normal well because it is in P-well 310, which is possible because of the first insulator BOX region 306. Similarly, the P-type transistor 304 is normal well because it is in the N-well 312, which is possible because of the second insulator BOX region 308. The normal wells below the insulator BOX regions allow the first well body bias voltage ($V_{BN}$) and the second well body bias voltage ($V_{BP}$) to act as back gates. In the N-type transistor 302, for example, if the back gate voltage is driven to a positive voltage above the source, the back gate voltage aids the regulator poly gate by increasing the current as if were reducing a magnitude of a first threshold voltage ($V_{TN}$) of the N-type transistor 302. Similarly for the P-type transistor 304, if the back gate is driven to a negative voltage below the source, the current is added as if a second threshold voltage ($V_{TP}$) of the P-type transistor 304 is reduced in magnitude. By changing the back gate voltage, the direct current (DC) bias condition in the transistors is changed. This can be done to change the transconductance. The back gate voltages can be used for controlling the input impedance over a very wide temperature range, including across a cryogenic temperature range, such as illustrated in FIGS. 4A-4B. In one embodiment, the complementary transistor pair 300 is fabricated using SOI technology. In another embodiment, the complementary transistor pair 200 is fabricated using FD-SOI technology.

Figure 4A:
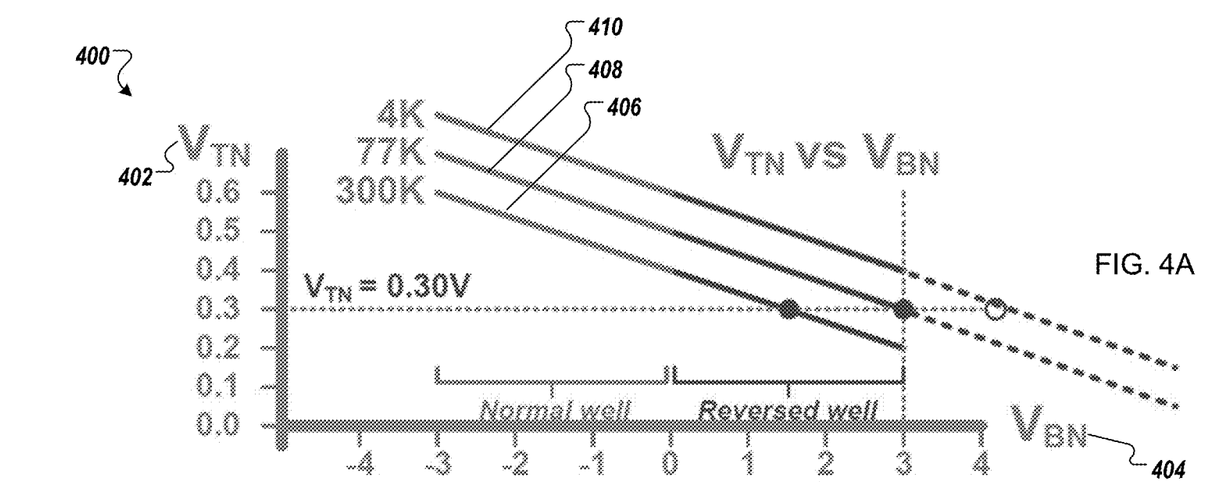
FIG. 4A is a graph illustrating a first threshold voltage of a N-type transistor as a function of a first well body bias voltage in three different temperature domains according to one embodiment.
Figure 4B:
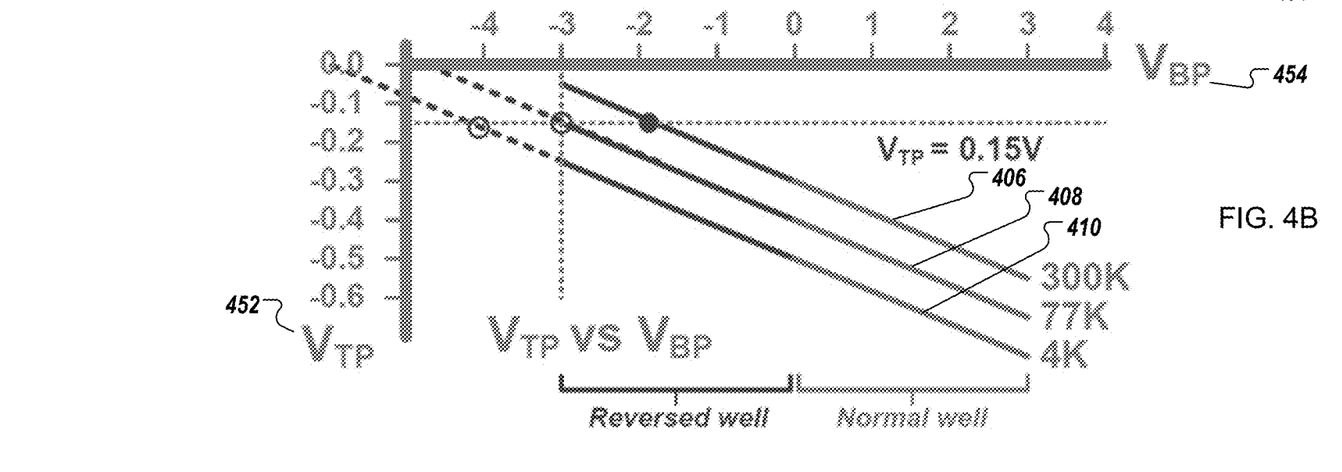
FIG. 4B is a graph illustrating a second threshold voltage of a P-type transistor as a function of a second well body bias voltage in three different temperature domains according to one embodiment.

FIG. 4A is a graph 400 illustrating a first threshold voltage 402 of a NMOS type transistor as a function of a first well body bias voltage 404 in three different temperature domains according to one embodiment. As illustrated, a first temperature domain 406 is at approximately 300K, a second temperature domain 408 is at approximately 77K, and a third temperature domain 410 is at approximately 4K. As illustrated in FIG. 4A, the first threshold voltage 402 can be set at 0.3 volts between a temperature range between 300K and 77K by the first well body bias voltage 404 between 1.5V to 3V. The first threshold voltage 402 can be set at 0.3 volts between a temperature range between 300K and 4K by the first well body bias voltage 404 between 1.5V to 4.2V.

As illustrated in FIG. 4A, the N-type transistor using FD-SOI technology operate well for cryogenic applications as the threshold voltage ($V_{th}$) variation can be canceled by applying a large forward well bias. For example, the threshold voltage $V_{th}$, is a function of the nominal threshold voltage at room temperature less a fraction (0.13) of the first well body bias voltage 404 (Vbn) using the FD-SOI technology as expressed in the following equation:

$$Vth = Vto - 01.3\ Vbn,$$

where Vto is the nominal threshold voltage at 0V and Vbn is the threshold voltage at some temperature. It should be noted that by making Vbn positive, the Vth threshold voltage decreases in value.

The transconductance of either a N-type transistor or a P-type transistor can be a function of the drain current and the sensitivity of the drain current, as expressed in the following equation:

$$Gm = 2 * Ids/(Vgs - Vth)$$

In essence, the first well body bias voltage 404 can remove the temperature dependency of the device-type transistor, at least over a very large temperature range as illustrated in FIG. 4A.

FIG. 4B is a graph 450 illustrating a second threshold voltage 452 of a P-type transistor as a function of a second well body bias voltage 454 in the same three different temperature domains according to another embodiment. As illustrated in FIG. 4B, the second threshold voltage 452 can be set at −0.15 volts between a temperature range between 300K and 77K by the second well body bias voltage 454 between −2V to −3V. The second threshold voltage 452 can be set at −0.15 volts between a temperature range between 300K and 4K by the second well body bias voltage 454 between 1.5V to 4.2V.

As illustrated in graph 400, by applying reverse well bias at the lower cryogenic temperatures, the threshold voltage of the PMOS and the NMOS devices can be kept in a reasonable range of about 300 mV. By comparison in graph 450, using the Normal well bias may not be as impactful because the magnitude of the threshold voltage is higher to begin with. Also, using normal well bias, there is a diode that forward biases.

Figure 5:
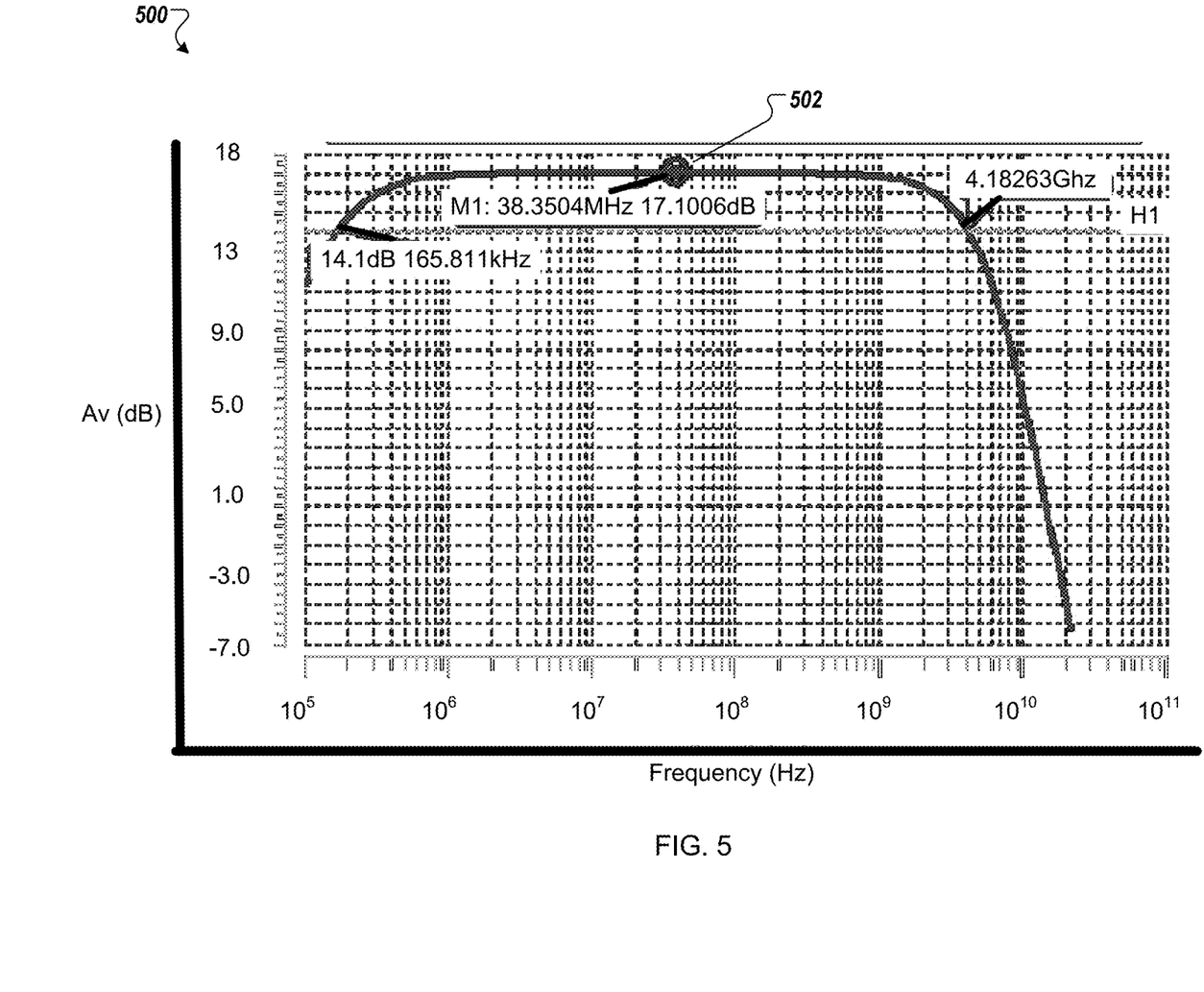
FIG. 5 is a graph illustrating gain of the amplifier circuit of FIG. 1 as a function of frequency according to one embodiment.

FIG. 5 is a graph 500 illustrating gain 502 of the amplifier circuit 100 of FIG. 1 as a function of frequency according to one embodiment. The gain 502 of the amplifier circuit 100 is measured in decibel (dB) over a logarithmic frequency scale between 100 kHz to 100 GHz. As illustrated the amplifier circuit 100 has a gain over 14 dB between 165 kHz to 4.2 GHz. Alternatively, other gains may be achieved with the amplifier circuit 100. As described herein, the shunt resistance feedback does not contribute noise directly at the input of the amplifier circuit 100 and operates better than a common source amplifier as all devices contribute gain. With the amplifier circuit 100 there is no signal attenuation like there is in a ground-reference termination configuration. Also, the input impedance can be trimmed to be a stable value over a very wide temperature range, as illustrated in FIG. 6.

Figure 6:
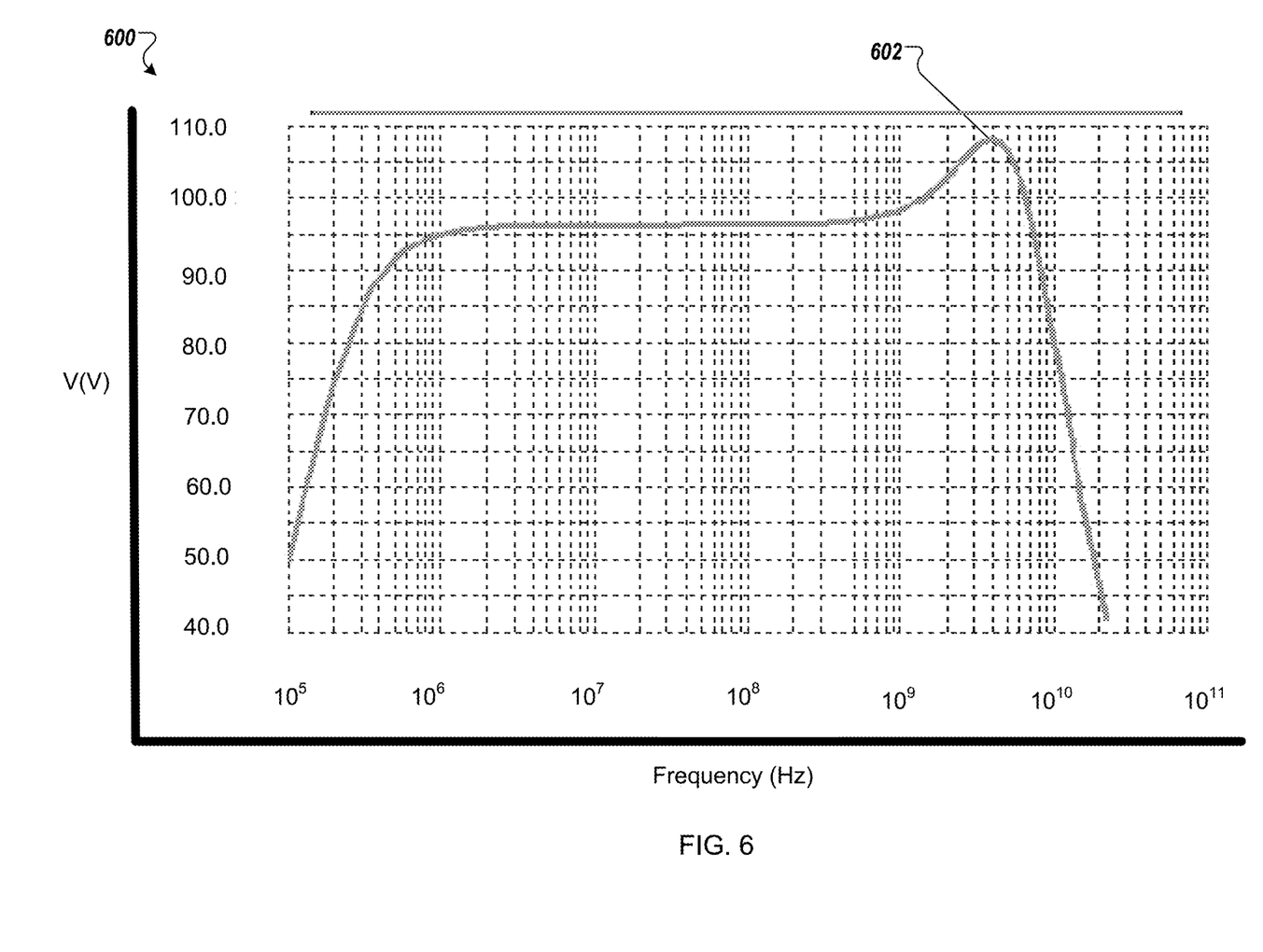
FIG. 6 is a graph illustrating an input impedance of the amplifier circuit of FIG. 1 as a function of frequency according to one embodiment.

FIG. 6 is a graph 600 illustrating input impedance 602 of the amplifier circuit 100 of FIG. 1 as a function of frequency according to one embodiment. The input impedance 602 of the amplifier circuit 100 is measured in ohms over a logarithmic frequency scale between 100 kHz to 100 GHz. The input impedance 602 can be set between 50 ohms and 110 ohms in the mid-portion of this frequency range. Also, as described herein, the input impedance 602 is a weak function of the shunt resistance feedback of the amplifier circuit 100. An impedance match of the input impedance 602 at differential terminals of the amplifier circuit 100 to an output impedance of a transmitter can be adjusted by adjusting any one or more of three bias conditions as described herein, including the adjustment(s) to the PMOS body voltage, the NMOS body voltage, or the current from the common current source.

In FIG. 6, the input impedance 602 is a differential input impedance of the illustrated frequency range. The input impedance 602 can be matched as a function of the shunt resistance feedback $R_F$ and the transconductance of the complementary transistor pairs of the amplifier circuit 100, as expressed in the following approximation:

$$Zin, single = \frac{1}{gme} + \frac{R_F}{gme * roe}$$

Where ro, e is the equivalent output conductance and gm, e is the transconductance of the complementary transistor pair. The subscript e in gm and ro denotes equivalent transconductance and equivalent output conductance. The complementary transistor pair has an equivalent input capacitance, an equivalent transconductance, and an equivalent output conductance that are lumped values from the NMOS and PMOS transistors of the complementary transistor pair, as expressed in the following equations:

$$C_E = C_{GP} + C_{GN}$$

$$g_{me} = g_{mp} + g_{mn}$$

$$g_{DSe} = g_{DSp} + g_{DSn}$$

$$r_{0e} = \frac{1}{g_{DSe}}$$

Parasitic capacitances in the CMOS amplifier and the output load cause the gain of the complementary transistor pair to decrease above some high frequency. This decrease in the gain predictably increases the input impedance of the amplifier around the high frequency causing input impedance peak. The peaking of the complementary transistor pair cancels the effect of the input capacitance (Cin), which can reduce system bandwidth and mismatch the input impedance of the amplifier circuit. By canceling the input capacitance (Cin), the peaking extends the bandwidth and makes the impedance flatter over a wider range of frequencies. The subscript e in gm and ro denotes equivalent transconductance and equivalent output conductance of the complementary transistor pair.

Figure 7:
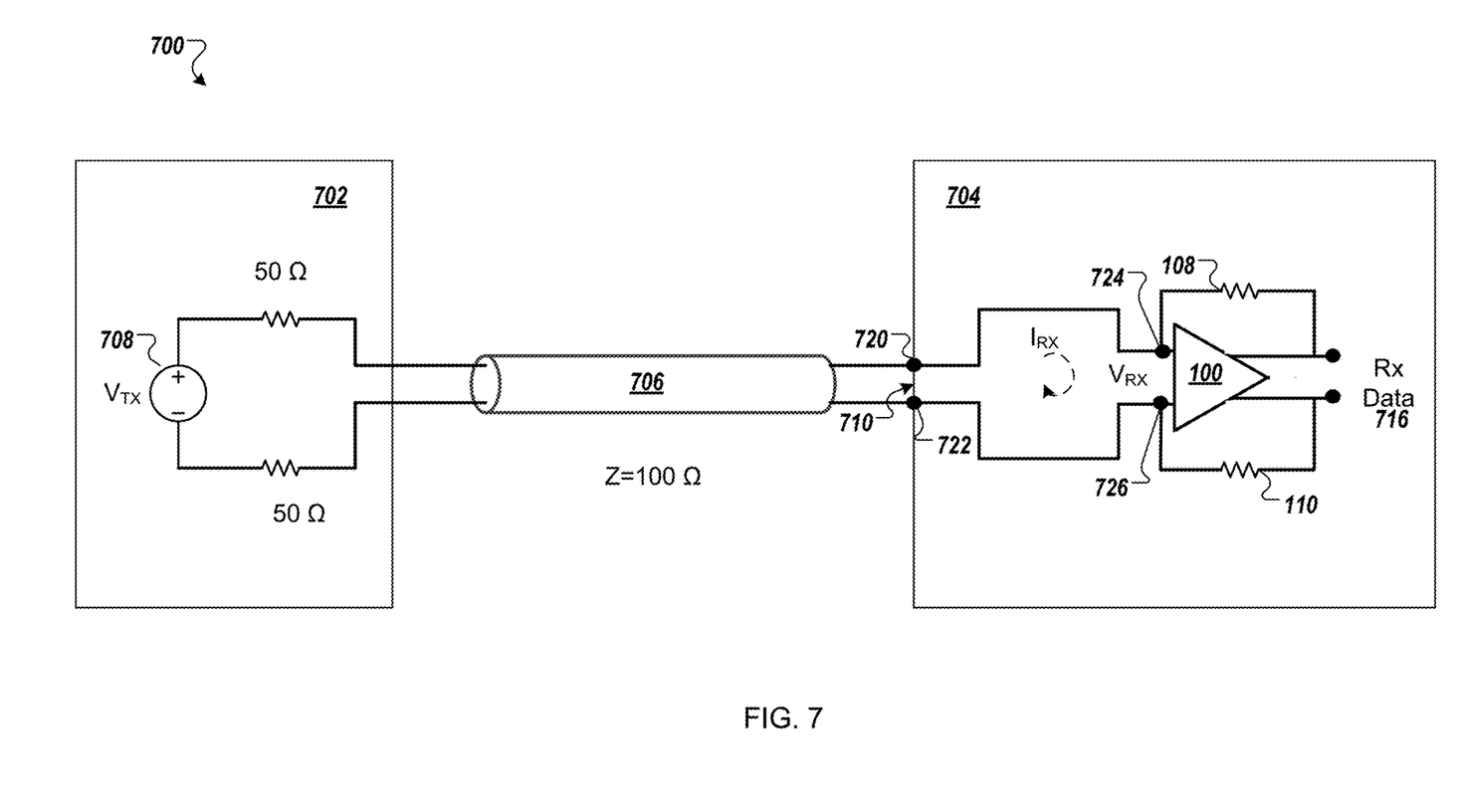
FIG. 7 is a schematic diagram illustrating a system with a wireline transmitter and a wireline receiver with the amplifier circuit of FIG. 1 according to one embodiment.

FIG. 7 is a schematic diagram illustrating a system 700 with a wireline transmitter 702 and a wireline receiver 704 with the amplifier circuit 100 of FIG. 1 according to one embodiment. The wireline transmitter 702 has a signal source 708 that generates a transmit voltage ($V_{TX}$) that is transmitted over a signaling channel 706 that is a pair of conductors to the wireline receiver 704. The wireline receiver 704 includes the amplifier circuit 100 of FIG. 1. As described above, an input impedance of the amplifier circuit 100 can be adjusted by the transconductance of the amplifier circuit 100. In the depicted embodiment, an output impedance of the wireline transmitter 702 is 100 ohm. Despite the temperature domain in which the wireline receiver 704 is located, the input impedance of the wireline receiver 704 can be adjusted to match the characteristic of the signaling channel 706. As illustrated in FIG. 7, an input impedance 710 can be a measure of a receive voltage ($V_{RX}$) across the input terminals of the amplifier circuit 100 and a receiver current ($I_{RX}$). As described above, the input impedance 710 can be adjusted using any one or more of the bias conditions described herein. As described above, the amplifier circuit 100 may have shunt resistors 108, 110 coupled between the input terminals and the corresponding output terminals. The amplifier circuit 100 operates to amplify the $V_{RX}$ signal to receive data ($R_X$ data) 716.

In one embodiment, the wireline receiver 704 is an integrated circuit having a first interconnect terminal 720 and a second interconnect terminal 722 to receive a differential input signal over a pair of conductors. The amplifier circuit 100 includes a first input node 724 coupled to the first interconnect terminal 720 and a second input node 726 coupled to the second interconnect terminal 722. The amplifier circuit 100 includes a common current source and a common voltage node (not illustrated in FIG. 7). The amplifier circuit 100 may also include a first complementary transistor pair coupled to the first input node 724 and a second complementary transistor pair coupled to the second input node 726. The first and second complementary transistor pairs are coupled between the common current source and a common voltage node. The input impedance 710 of the amplifier circuit 100 may be controlled by a transconductance of the first complementary transistor pair and the second complementary transistor pair. An output of the amplifier circuit 100 can output the Rx data 716 to additional signal processing receiver stages (not illustrated in FIG. 7). The receiver circuit may include circuitry to generate digital data based on the amplified signal. The wireline receiver 704 can output an amplified signal based on the differential input signal. In another embodiment, the wireline receiver 702 may include other components, such as a memory cell that is configured to store digital data generated by the receiver circuit.

In one embodiment, the wireline receiver 704 and the amplifier circuit 100 are located in a first temperature domain and the wireline transmitter 702 is located in a second temperature domain that is lower in temperature than the first temperature domain. The first and second temperature domains may be cryogenic temperature domains. The wireline transmitter 702 may be part of a processing system that includes one or more execution logic circuits. The execution logic circuits may include Josephson junctions. Alternatively, the execution logic circuits can be a digital circuit based on single-flux-quantum (SFQ) logic. Alternatively, the execution logic circuits may be an analog circuit or the execution logic circuit resides on an integrated circuit.

In another embodiment, a computer system may include memory circuits in a first temperature domain. The memory circuits may include one or more storage—class memory (SCM) components, flash non-volatile memory (NVM) components, phase-changed memory (PCM) components, resistive random-access memory (RRAM or ReRam) components, volatile memory components, non-volatile memory components, dynamic random access memory (DRAM) components, or any combination thereof. The memory circuits may also include a receiver for each pair of conductors to receive a differential signal. The memory circuits may be part of a memory system that includes multiple stacks of DRAM devices located in the first temperature domain ($T_1$). Multiple DRAM devices can be disposed on one or more substrates. The memory subsystem may also include multiple buffer components located in the first temperature domain ($T_1$). The first temperature domain ($T_1$) may be a cryogenic temperature (i.e., less than 93.15K). A processing system (not illustrated in FIG. 7) is located in a second temperature domain ($T_2$) that is lower in temperature than the first temperature domain. The second temperature domain ($T_2$) may be less than in temperature than cryogenic temperatures (i.e., less than 93.15K).

The processing system may include any type of electronic component or integrated circuit device or devices. In the depicted embodiment, the processing system may include multiple interfaces to the multiple stacks in the memory subsystem, multiple processor cores, and transaction steering logic coupled between the interfaces and the processor cores. In one embodiment, the interfaces of the processing system are coupled to the memory subsystem via multiple links, such as 960 links (or other signaling channels). For example, the multiple links can connect the multiple interfaces of the processing system to the multiple buffer components in the second temperature domain ($T_2$) and the multiple buffer components can connect to the multiple stacks in the memory subsystem. Although a processing system may include multiple processor cores, in other embodiments, the processing system may be a single processor, a System on Chip (SoC) device including one or more cores, a controller, or other types of processing devices. As referred to herein, the processing system is composed of execution logic circuits, execution logic circuits (e.g., Josephson Junction logic), a processor, a processing component, as well as a component in a cryogenic temperature domain. The component is intended to include or be representative of any type of integrated circuit component including, for example and without limitation, integrated circuit devices or buffer/bridge devices having high speed serial links, chips such as processors, system on chip (SOC), field programmable gate arrays (FPGA), application specific integrated circuits (ASIC), or the like. As referred to herein, the memory subsystem has memory components and memory buffer components that may be located in two different temperature domains. Alternatively, both the memory components and the memory buffer components are located in the same temperature domain, but the processing system is located in another temperature domain. At least the memory components are intended to include or be representative of any type of integrated circuit component including, for example and without limitation, integrated-circuit memory devices of various types (e.g., dynamic random access memory (DRAM), static random access memory (SRAM), and any of the numerous types of non-volatile memory, including Flash memory, phase-change memory, magneto-resistive memory, etc.), integrated-circuits having a memory control function (e.g., dedicated memory controllers, processors, chipset components, etc.) or any other type of integrated circuit device in the respective temperature domain. One or more links may be coupled between the memory subsystem in the first temperature domain and the processing system in the second temperature domain. Each link may be a pair of conductors on which a signal is carried between the memory components of the memory subsystem 102 and the components of the processing system 104. The conductors can be made of a combination of copper and niobium. Alternatively, the conductors can be made of other materials.

In one embodiment, the processing system and the memory subsystem are part of a cryogenic computer. It should be noted that in some cases the processing system can include a transmitter (e.g., a memory controller) that sends a signal to a receiver in the memory subsystem over a link, such as in a write operation. In one embodiment, the memory buffer components 103 each include a receiver that is coupled to a link and a transmitter that is coupled to a link. The memory components may each include a receiver that is coupled to a link. In a further embodiment, the memory subsystem includes a transmitter that sends a signal to a receiver in the processing system over a link, such as in a read operation. In one embodiment, the memory components may each include a transmitter that is coupled to a link. The memory buffer components each include a receiver that is coupled to a link and a transmitter that is coupled to a link.

The receiver may include the fully-differential CMOS low-noise input amplifier circuit described herein. The computer system may also include execution logic circuits in a second temperature domain (e.g., 4K) that is lower in temperature than the first temperature domain (e.g., 77K). The amplifier circuit includes a first input node coupled to a first interconnect terminal and a second interconnect terminal. The amplifier circuit also includes a second input node coupled to a second interconnect terminal. The first interconnect terminal and the second interconnect terminal receive a differential input signal over a pair of conductors. The amplifier circuit also includes a common current source, a common voltage node, a first complementary transistor pair, and a second complementary transistor pair. The first complementary transistor pair is coupled to the first input node, the common current source, the common voltage node, and a first output node. The second complementary transistor pair is coupled to the second input node, the common current source, the common voltage node, and a second output node. A first resistor is coupled between the first input node and the first output node and a second resistor is coupled between the second input node and the second output node. As described herein, an input impedance of the amplifier circuit is controlled by a transconductance of the first complementary transistor pair and the second complementary transistor pair.

In another embodiment of an electronic system, a first component is in a first temperature domain and a second component is in a second temperature domain. The first temperature domain is a first cryogenic temperature domain and the second temperature domain is a second cryogenic temperature domain that is lower in temperature than the first temperature domain. The first component includes at least one amplifier circuit with matched complementary transistor pairs coupled at a common source node that is coupled to a common current source. Each of the matched complementary transistor pairs has a shunt resistive feedback. An input impedance of the at least one amplifier circuit is controlled by a transconductance of the first complementary transistor pair and the second complementary transistor pair. In one embodiment, the transconductance of the at least one amplifier circuit is adjusted by a magnitude of the current source. In another embodiment, the transconductance of the at least one amplifier circuit is adjusted by a first magnitude of a first well body bias voltage applied to the at least one amplifier circuit.

In one embodiment, the first component is a memory component and the second component is a processor residing on an integrated circuit. In one embodiment, the processor is part of a cryogenic computer and the memory component is part of a memory subsystem. The memory subsystem can have multiple DRAM devices disposed on a substrate. In a further embodiment, a flex cable is coupled between the first component and the second component. The flex cable includes at least one link upon which a signal is carried. A first segment of the at least one link is in the second temperature domain and a second segment of the at least one link is in the first temperature domain. In one embodiment, the second temperature domain is a first cryogenic temperature domain at approximately 4 Kelvin (4K) and the first temperature domain is a second cryogenic temperature at approximately 77K. Alternatively, the second temperature domain is a first cryogenic temperature domain is between approximately 9K to 3K and the first temperature domain is a range between approximately 217K to 9K.

Figure 8:
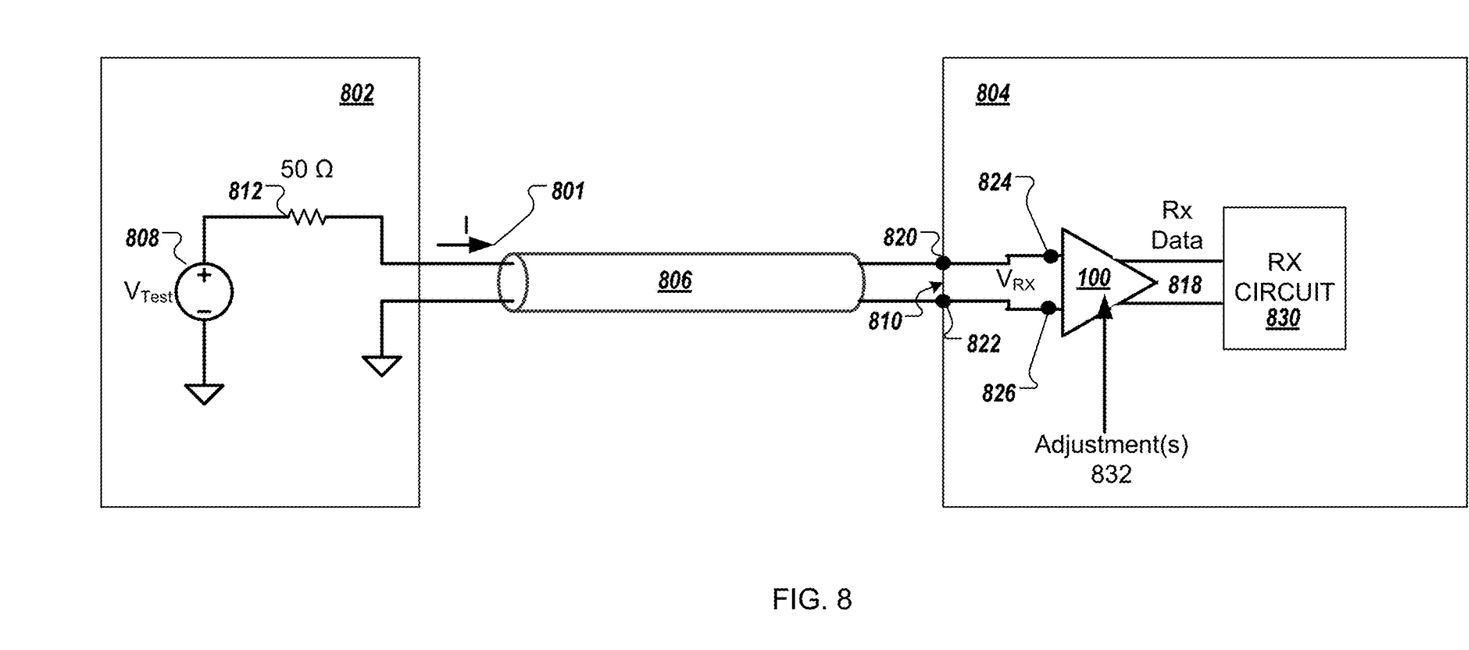
FIG. 8 is a schematic diagram illustrating a tester device and an integrated circuit with the amplifier circuit of FIG. 1 according to one embodiment.

FIG. 8 is a schematic diagram illustrating a tester device 802 and an integrated circuit 802 with the amplifier circuit 100 of FIG. 1 according to one embodiment. The tester device 802 is coupled to an integrated circuit 804 over a pair of conductors 806. The test device 802 includes a voltage source 808 coupled to one of the pair of conductors 806 through a 50-ohm resistor 812. The voltage source 802 can generate a test voltage ($V_{Test}$) to generate a current 801. The other conductor of the pair of conductors 806 is grounded at the tester device 802. The integrated circuit 804 includes a first interconnect terminal 820 and a second interconnect terminal 822 that are coupled to the pair of conductors 806. A first input node 824 of the amplifier circuit 100 is coupled to the first interconnect terminal 820 and a second input node 826 of the amplifier circuit 100 is coupled to the second interconnect terminal 822. The amplifier circuit 100 is to amplify an input voltage ($V_{RX}$) to generate an amplified signal for the RX data 818 that is input into a receiver circuit 830. The tester device 802 can apply different voltages to generate different currents 801 to determine an adjustment 832, if any, to adjust a transconductance of the amplifier circuit 100 to adjust input impedance 810. One method of adjusting the transconductance is described below with respect to FIG. 9.

Figure 9:
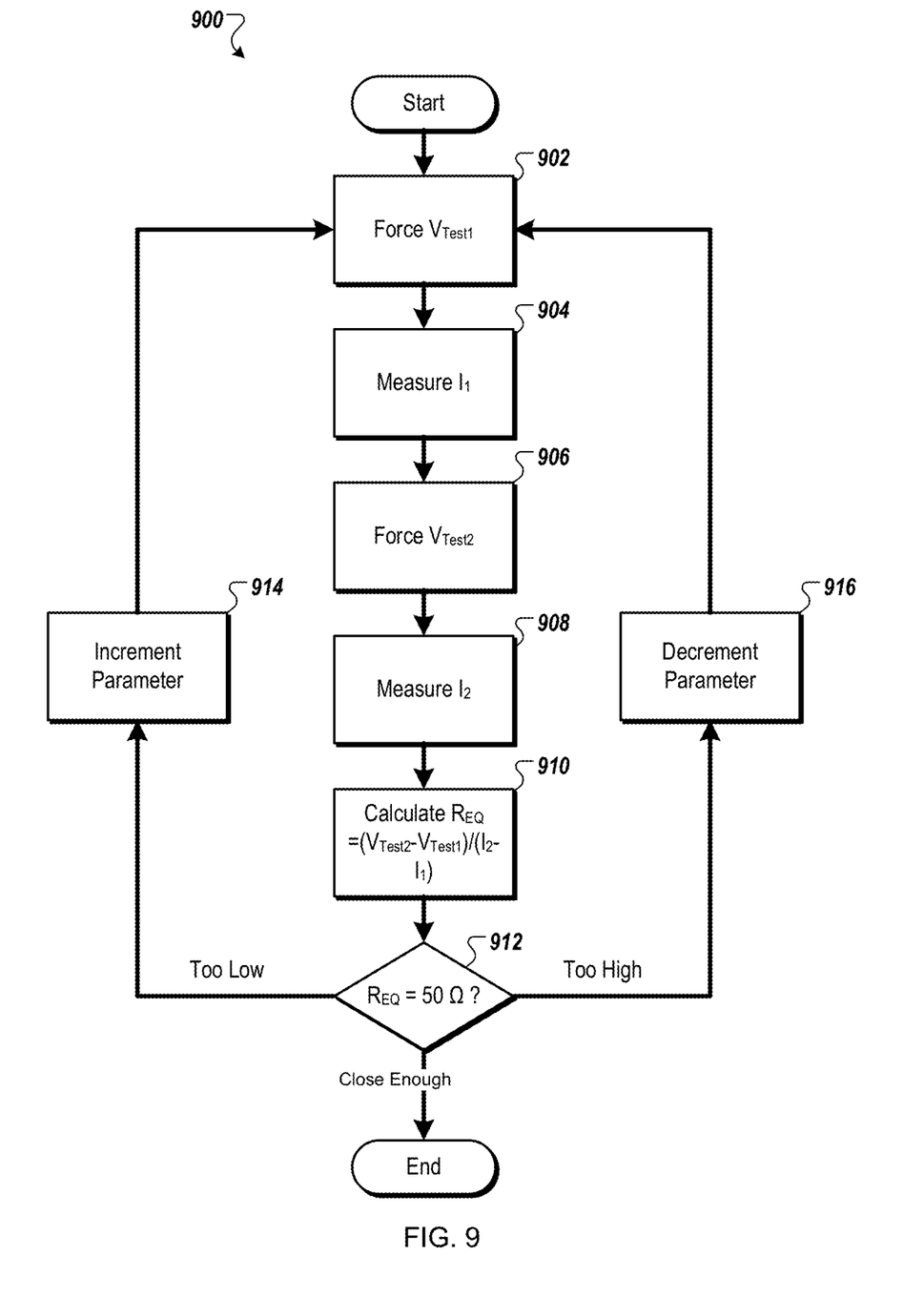
FIG. 9 is a flow diagram of a method of adjusting an impedance of an amplifier circuit according to one embodiment.

FIG. 9 is a flow diagram of a method 900 of adjusting an impedance of an amplifier circuit 100 according to one embodiment. The method 900 may be performed by a tester device, such as the tester device 802. Alternatively, the method 900 can be performed by processing logic comprising hardware, software, firmware, or any combination thereof of an integrated circuit. The integrated circuit can perform the method 900 under the direction of a tester device, for example.

Referring back to FIG. 9, the processing logic applies a first input voltage across input terminals of a fully-differential complementary metal-oxide-semiconductor (CMOS) low-noise amplifier (LNA) circuit with matched complementary transistor pairs coupled at a common source node that is coupled to a common current source, wherein the matched complementary transistor pairs having shunt resistive feedback (block 902). The processing logic measures a first current at the amplifier circuit while the first input voltage is applied across the input terminals (block 904). The processing logic applies a second input voltage across the input terminals of the amplifier circuit (block 906) and measures a second current at the amplifier circuit while the second input voltage is applied across the input terminals (block 908). The processing logic calculates an impedance value based on the first current, the second current, the first input voltage, and the second input voltage (block 910). For example, the processing logic can calculate the input impedance ($R_{EQ}$) with the following equation:

$$R_{EQ} = \frac{(VTest2 - VTest1)}{(I_2 - I_1)}$$

The processing logic compares the impedance value against a specified impedance setting for the amplifier circuit (block 912) (e.g., $R_{EQ}$=50 ohms). If the impedance value is too low (less than the specified impedance setting), the processing logic increments a parameter (block 914) and returns to block 902. If the impedance value is too high (greater than the specified impedance setting, the processing logic decrements a parameter (block 916) and returns to block 902. In one embodiment, the parameter is a transconductance parameter of the amplifier circuit. At block 902, the method 900 can repeat the applying the first input voltage, measuring the first current, applying the second input voltage, measuring the second currents, calculating, comparing, and adjusting the transconductance parameter until the impedance value is within a specified tolerance of the specified impedance setting for the amplifier circuit (block 912), and the method 900 ends.

In one embodiment, the transconductance parameter is adjusted by adjusting a magnitude of the common current source. In another embodiment, the transconductance parameter is adjusted by adjusting a magnitude of a first well body bias voltage applied to the matched complementary transistor pairs. In another embodiment, the transconductance parameter is adjusted by at least one of: adjusting a magnitude of a first well body bias voltage applied to N-type transistors of the matched complementary transistor pairs or adjusting a magnitude of a second well body bias voltage applied P-type transistors of the matched complementary transistor pairs.

It should be noted that, in other embodiments, other operations as described herein may be performed by the processing logic.

In the above description, numerous details are set forth. It will be apparent, however, to one of ordinary skill in the art having the benefit of this disclosure, that embodiments of the present invention may be practiced without these specific details. In some instances, well-known structures and devices are shown in block diagram form, rather than in detail, in order to avoid obscuring the description.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this disclosure, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this disclosure and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such.

The above description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth above are merely exemplary. Particular implementations may vary from these exemplary details and still be contemplated to be within the scope of the present invention.

The description above includes specific terminology and drawing symbols to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multiconductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology, or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "de-asserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or de-asserts, if explicitly stated or indicated by context) the signal on a signal line coupled between the signal driving and signal receiving circuits. A signal line is said to be "activated" when a signal is asserted on the signal line, and "deactivated" when the signal is de-asserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement. While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

It is to be understood that the above description is intended to be illustrative and not restrictive. Many other embodiments will be apparent to those of skill in the art upon reading and understanding the above description. The scope of the invention should, therefore, be determined with reference to the appended claims, along with the full scope of equivalents to which such claims are entitled.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. An amplifier circuit comprising:
   a current source;
   a first complementary transistor pair coupled between a first source node and a second source node, the first source node being coupled to the current source and the first complementary transistor pair comprising a first input terminal and a first output terminal;
   a second complementary transistor pair coupled between the first source node and the second source node, the second complementary transistor pair comprising a second input terminal and a second output terminal;
   a first shunt resistor coupled between the first input terminal and the first output terminal; and
   a second shunt resistor coupled between the second input terminal and the second output terminal, wherein an input impedance between the first input terminal and the second input terminal is controlled by a transconductance of the first complementary transistor pair and the second complementary transistor pair, wherein the transconductance of the first complementary transistor pair and the second complementary transistor pair is adjusted by a first magnitude of a first well body bias voltage applied to a first well of the first complementary transistor pair and by a second magnitude of a second well body bias voltage applied to a second well of the first complementary transistor pair.

2. The amplifier circuit of claim 1, wherein the transconductance of the first complementary transistor pair and the second complementary transistor pair is adjusted by a magnitude of the current source.

3. The amplifier circuit of claim 1, wherein the current source is a programmable current source, and wherein the transconductance of the first complementary transistor pair and the second complementary transistor pair is adjusted by a magnitude of the programmable current source.

4. The amplifier circuit of claim 1, wherein the transconductance of the first complementary transistor pair and the second complementary transistor pair is adjusted by a third magnitude of a third well body bias voltage applied to a first well of the second complementary transistor pair and by a fourth magnitude of a fourth well body bias voltage applied to a second well of the second complementary transistor pair.

5. The amplifier circuit of claim 1, wherein the transconductance of the first complementary transistor pair and the second complementary transistor pair is adjusted by the first magnitude of the first well body bias voltage applied to a first well of the second complementary transistor pair and the second magnitude of the second well body bias voltage applied to a second well of the second complementary transistor pair.

6. The amplifier circuit of claim 1, wherein the input impedance is controlled over a cryogenic temperature range by adjusting the transconductance of the first complementary transistor pair and the second complementary transistor pair such that the input impedance is within a specified tolerance of a specified impedance setting over the cryogenic temperature range.

7. The amplifier circuit of claim 1, wherein the input impedance is controlled over a temperature range between 123 Kelvin (123K) and 4K by adjusting the transconductance of the first complementary transistor pair and the second complementary transistor pair such that the input impedance is within a specified tolerance of a specified impedance setting over the temperature range.

8. The amplifier circuit of claim 1, wherein the first complementary transistor pair comprises:
   a first N-type transistor with a gate terminal coupled to the first input terminal, a drain terminal coupled to the first output terminal, and a source terminal coupled to the first source node; and
   a first P-type transistor with a gate terminal coupled to the first input terminal, a drain terminal coupled to the first output terminal, and a source terminal coupled to the second source node, wherein the second complementary transistor pair comprises:
   a second N-type transistor with a gate terminal coupled to the second input terminal, a drain terminal coupled to the second output terminal, and a source terminal coupled to the first source node; and
   a second P-type transistor with a gate terminal coupled to the second input terminal, a drain terminal coupled to the second output terminal, and a source terminal coupled to the second source node.

9. The amplifier circuit of claim 1, wherein the first complementary transistor pair comprises:
   a first N-type transistor with a gate terminal coupled to the first input terminal, a drain terminal coupled to the first output terminal, a source terminal coupled to the first source node, and a first well body bias voltage terminal; and
   a first P-type transistor with a gate terminal coupled to the first input terminal, a drain terminal coupled to the first output terminal, a source terminal coupled to the second source node, and a second well body bias voltage terminal, wherein the second complementary transistor pair comprises:
   a second N-type transistor with a gate terminal coupled to the second input terminal, a drain terminal coupled to the second output terminal, a source terminal coupled to the first source node, and a third well body bias voltage terminal; and
   a second P-type transistor with a gate terminal coupled to the second input terminal, a drain terminal coupled to the second output terminal, a source terminal coupled to the second source node, and a fourth well body bias voltage terminal, wherein the first well body bias voltage terminal and the third well body bias voltage terminal are coupled to a first well body bias voltage, and wherein the second well body bias voltage terminal and the fourth well body bias voltage terminal are coupled to a second well body bias voltage.

10. The amplifier circuit of claim 1, wherein a first transistor of the first complementary transistor pair is disposed on a first insulator buried oxide layer (BOX) region of a BOX layer, a second transistor of the first complementary transistor pair is disposed on a second insulator BOX region of the BOX layer, a first transistor of the second complementary transistor pair is disposed on a third insulator BOX region of the BOX layer, and a second transistor of the second complementary transistor pair is disposed on a fourth insulator BOX region of the BOX layer.

11. The amplifier circuit of claim 1, wherein the first complementary transistor pair is fabricated using at least one of Silicon On Insulator (SOI) technology or Fully Depleted Silicon On Insulator (FD-SOI) technology.

12. An integrated circuit comprising:
    a first interconnect terminal and a second interconnect terminal to receive a differential input signal over a pair of conductors; and
    a fully-differential complementary metaloxidesemiconductor (CMOS) low-noise amplifier (LNA) circuit comprising:
        a first input node coupled to the first interconnect terminal;
        a second input node coupled to the second interconnect terminal;
        a common current source;
        a common voltage node;
        a first complementary transistor pair coupled to the first input node, the common current source, the common voltage node, and a first output node;
        a second complementary transistor pair coupled to the second input node, the common current source, the common voltage node, and a second output node;
        a first resistor coupled between the first input node and the first output node; and
        a second resistor coupled between the second input node and the second output node, wherein an input impedance of the fully-differential CMOS LNA circuit is controlled by a transconductance of the first complementary transistor pair and the second complementary transistor pair by applying a first magnitude of a first well body bias voltage to a first well of the first complementary transistor pair and by applying a second magnitude of a second well body bias voltage to a second well of the first complementary transistor pair.

13. The integrated circuit of claim 12, further comprising a receiver circuit coupled to the fully-differential CMOS LNA circuit, wherein the fully-differential CMOS LNA circuit is to output an amplified signal based on the differential input signal, wherein the receiver circuit is to generate digital data based on the amplified signal.

14. The integrated circuit of claim 13, further comprising a memory cell coupled to the receiver circuit, wherein the memory cell is to store the digital data.

15. The integrated circuit of claim 12, wherein the fully-differential CMOS LNA circuit is located in a first temperature domain and is configured to receive the differential input signal from an execution logic circuit located in a second temperature domain that is lower in temperature than the first temperature domain.

16. The integrated circuit of claim 15, wherein the execution logic circuit comprises at least one of a Josephson junction, a digital circuit based on single-flux-quantum (SFQ) logic, an analog circuit.

17. The integrated circuit of claim 15, wherein the second temperature domain is a cryogenic temperature domain.

18. A method comprising:
    applying a first input voltage across input terminals of an amplifier circuit with matched complementary transistor pairs coupled at a common source node that is coupled to a common current source, wherein the matched complementary transistor pairs having shunt resistive feedback;
    measuring a first current at the amplifier circuit;
    applying a second input voltage across the input terminals of the amplifier circuit;
    measuring a second current at the amplifier circuit;
    calculating an impedance value based on the first current, the second current, the first input voltage, and the second input voltage;
    comparing the impedance value against a specified impedance setting for the amplifier circuit;
    adjusting a transconductance parameter of the amplifier circuit; and
    repeating the applying the first input voltage, measuring the first current, applying the second input voltage, measuring the second current, calculating, comparing, and adjusting the transconductance parameter until the impedance value is within a specified tolerance of the specified impedance setting for the amplifier circuit.

19. The method of claim 18, wherein the adjusting the transconductance parameter comprises adjusting a magnitude of the common current source.

20. The method of claim 18, wherein the adjusting the transconductance parameter comprises adjusting a magnitude of a first well body bias voltage applied to the matched complementary transistor pairs.

* * * * *